United States Patent [19]

Chiang et al.

[11] Patent Number: 4,737,933
[45] Date of Patent: Apr. 12, 1988

[54] CMOS MULTIPORT GENERAL PURPOSE REGISTER

[75] Inventors: Michael Chiang, Cupertino; John J. Zasio, Sunnyvale; Tien-Lai Hwang, Cupertino, all of Calif.

[73] Assignee: Storage Technology Partners, Santa Clara, Calif.

[21] Appl. No.: 468,602

[22] Filed: Feb. 22, 1983

[51] Int. Cl.⁴ .................. G06F 12/00; G11C 8/00
[52] U.S. Cl. .................. 364/900; 365/189; 365/230
[58] Field of Search ... 364/200 MS File, 900 MS File, 364/716; 365/230, 190, 189, 155, 156, 179; 307/465; 340/825.83

[56] References Cited

U.S. PATENT DOCUMENTS

| | | | |
|---|---|---|---|
| 3,983,538 | 9/1976 | Jones | 364/900 |
| 3,990,052 | 11/1976 | Gruner | 340/172.5 |
| 3,997,771 | 12/1976 | Perlowski | 364/900 |
| 4,079,455 | 3/1978 | Ozga | 364/200 |
| 4,104,719 | 8/1978 | Chu | 365/230 |
| 4,120,048 | 10/1978 | Fuhrman | 365/239 |
| 4,208,716 | 6/1980 | Porter et al. | 364/200 |
| 4,268,907 | 5/1981 | Porter et al. | 364/200 |
| 4,395,765 | 7/1983 | Moffitt | 365/174 |
| 4,410,964 | 10/1983 | Nordling | 365/230 |
| 4,412,312 | 10/1983 | Berger et al. | 365/189 |
| 4,447,891 | 5/1984 | Kadota | 365/190 |
| 4,491,937 | 1/1985 | Chan | 365/155 X |
| 4,502,110 | 2/1985 | Saito | 364/200 |
| 4,554,645 | 11/1985 | Furman | 365/189 |
| 4,580,245 | 4/1986 | Ziegler et al. | 365/190 |
| 4,610,004 | 9/1986 | Moller et al. | 365/230 |
| 4,616,341 | 10/1986 | Andersen et al. | 365/230 |
| 4,623,990 | 11/1986 | Allen et al. | 365/189 |

Primary Examiner—Archie E. Williams, Jr.
Assistant Examiner—Florin Munteanu
Attorney, Agent, or Firm—Woodcock, Washburn, Kurtz, Mackiewicz & Norris

[57] ABSTRACT

A general purpose register including two input ports and two output ports, each port being addressed by an independent addressing circuit. The general purpose register includes a number of internal registers, and the provision of four independent addresses enables data to be written into two internal registers while data is being read out of two internal registers. The general purpose register also includes circuitry for transferring data from the input ports directly to the output ports without entering the data into the internal registers. Interchanging of bytes of data input words is also accomplished by the general purpose register. The internal registers, the four independent addressing circuits, the data transferring circuitry and additional undedicated circuitry are integrated into a single chip.

16 Claims, 7 Drawing Sheets

CMOS MULTIPORT GENERAL PURPOSE REGISTER

BACKGROUND OF THE INVENTION

This invention relates to a general purpose register (GPR), used in the design of large computers, that provides for the temporary storage of information, and more particularly to a GPR fabricated using very large scale integration (VLSI) of complementary metal oxide semiconductor (CMOS) circuits. More specifically, the present invention relates to a GPR that has two input ports and two output ports and is designed such that two read operations and two write operations, using four independent addresses, with byte changing between the two inputs and also between an input and an output if desired, can be performed during one cycle of operation.

The use of general purpose registers in the design of large computers is common practice. As the name implies, GPR's are designed to be general purpose and a large number of them might he used in a large computer design to provide temporary storage for the computer hardware for data, addresses, instructions, etc., while the computer executes the instructions of a program.

GPR's have a relatively small number of registers, typically equal to some power of two, but generally no more than thirty-two. Each register of a GPR is an independent storage location but all registers have the same word size (a word consists of some defined number of bits). The word size and the speed of the GPR are determined by the particular application.

In its most simple form, a GPR has a single set of address lines that allow any of the registers to be addressed. When addressed, a register can have data written into it or data read from it, as determined by other control signals of the GPR. Only one write operation or one read operation can take place at a time.

A more sophisticated GPR is one that has two sets of address lines, two data input ports and two data output ports. This design allows two registers within the GPR to be addressed at the same time. Data can be read from both or written into both registers during the same cycle. Such operation is desirable since two data words are often required to be applied to an execution unit within the computer. Alterntively, a read operation from one addressed register and a write operation into the other addressed register during the same cycle is also possible. Control signals are used to enable either or both sets of addresses, and the read and write functions, during every operation.

If parity bits are used as part of the word to insure data integrity, the generation of the parity bits to be written and the checking of parity for the word read is performed by logic circuitry external to the GPR.

SUMMARY OF THE INVENTION

The primary objective of the present invention is to improve the design of general purpose registers to make them more versatile in their application. This is accomplished by a design which includes a GPR having two separate read addresses and two separate write addresses. Two input ports are associated with the two write addresses and two output ports are associated with the two read addresses.

The GPR is designed such that data can be read from two internal registers at the same time that data is being written into two different internal registers. This significantly increases the operating speed of a system utilizing the GPR. The design also allows the interchange of the bytes of the two data words on the two input ports or the bytes of an input port and its associated output port. Logic circuitry internal to the GPR checks for correct parity on all input bytes. The design allows data on either input port that is to be written in an internal register to also be made available on the associated output port for use on the next system cycle, by means of unique bypass circuitry.

The GPR is fabricated using CMOS circuitry and VLSI techiques. The GPR circuitry occupies approximately one-third of a CMOS chip. The remainder of the chip contains undedicated, general purpose circuitry. The invention allows a designer to customize the overall design of the GPR chip by utilizing the general purpose circuitry in the manner required for the particular application.

The unique features of the design, along with the undedicated circuitry, all on a single CMOS chip, allow the present invention to be used in applications where GPR's are not normally used, such as in the I/O channels, for temporary storage in the floating point logic, in variable field logic, in character manipulation logic, etc.

BRIEF DESCRIPTION OF THE DRAWINGS

The invention will be described with respect to the accompanying drawings wherein.

DESCRIPTION OF THE PREFERRED EMBODIMENT

The following description is of the presently contemplated mode of carrying out the invention. This description is made for the purpose of illustrating the general principles of the invention and should not be taken in a limiting sense. The scope of the invention is best defined by the appended claims.

Figure 1:
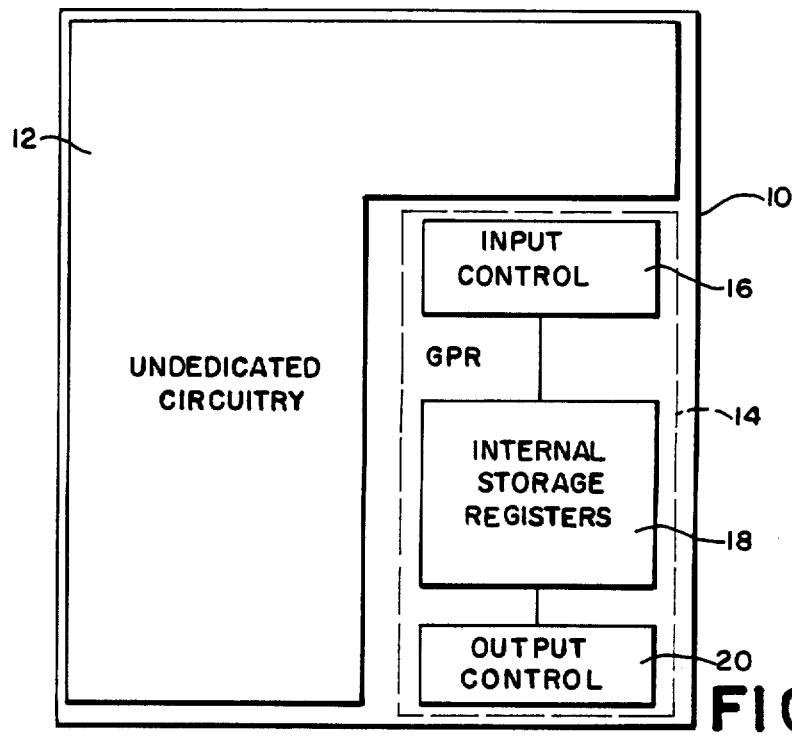
FIG. 1 is a diagrammatic top plan view of the chip of the present invention.

Referring to FIG. 1, a semiconductor chip 10 is seen to comprise two major elements: the undedicated circuitry 12, and the general purpose register 14. In the embodiment, the chip is made using a thirty by seventy-five array of blocks, each block consisting of eight CMOS transistors (four pairs of complementary transistors). The GPR portion 14 of the chip uses a twelve block by sixty block area of the array. Special circuitry, in addition to the standard eight transistor block, is used in the GPR portion of the chip.

The undedicated circuitry 12 consists of 1530 blocks which may be selectively interconnected to customize the GPR chip so as to perform a particular function. For example, four inverters or two two-input NAND gates can be made from one block, while a master-slave latch takes four blocks. The designer has literally thousands of logic elements available to use in customizing the chip. The customizing is done by interconnecting the blocks (which are formed in a semiconductor substrate) in the desired manner with metalization layers which overlie the substrate. The designers metalization pattern and the standard metalization patter for the GPR circuitry are combined to form metalization masks. These masks are then used to form metalization layers by means of photolithographic techniques.

The GPR portion 14 of the chip consists of three functional blocks: the input control 16, the internal storage registers 18, and the output control 20. The operation of each of these blocks is explained in the following paragraphs.

Figure 2:
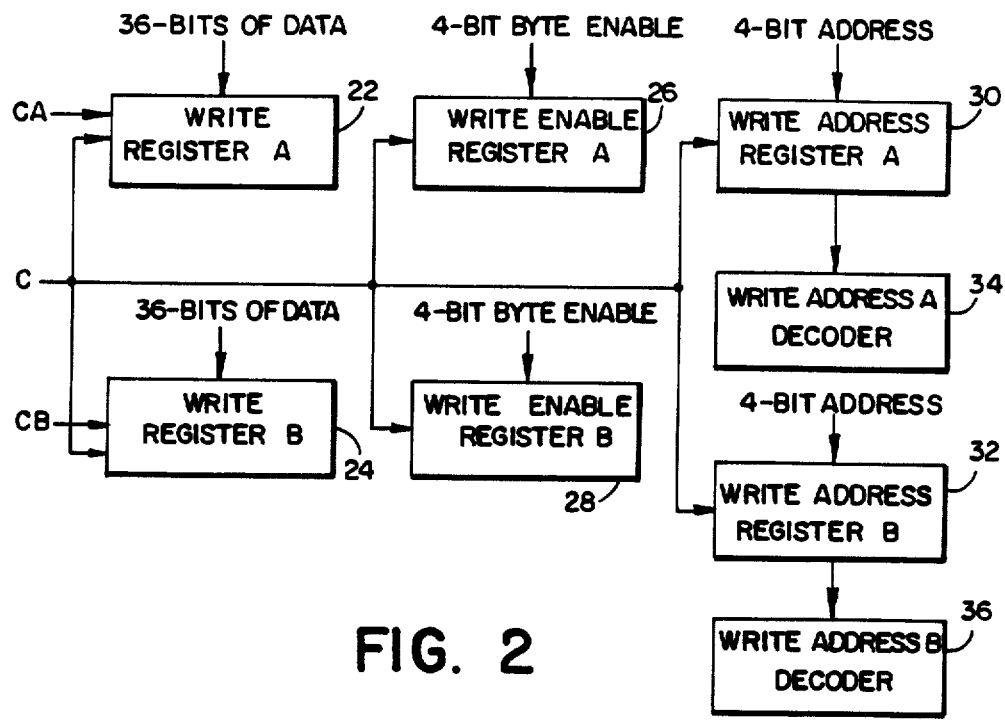
FIG. 2 is a block diagram showing the input control elements of the GPR.

Referring to FIG. 2, the elements that make up the input control portion 16 of the GPR are shown. As can he seen from FIG. 2, there are two separate sets of input control elements: one set for an A input port, and another set for a B input port. Each set of control elements consists of a write register 22 or 24, a write enable register 26 or 28, and a write address register 30 or 32, along with a write address decoder 34 or 36. The write registers 22 and 24 are used to hold the thirty-six bit word (consisting of four eight-bit bytes plus a parity bit for each byte) that may be written into the selected internal register of the GPR. A unique feature of the invention is the self contained parity logic within the two write registers 22 and 24. That is, each register 22 and 24 advantageously contains parity checking logic to check the parity of each byte. This is accomplished by using an exclusive-NOR parity tree wherein the eight bits of the byte are compared, in groups of two, by four exclusive-NOR gates. The four outputs are compared, in groups of two, by two exclusive-NOR gates, and the output of these two gates are compared by a single exclusive-NOR gate. The output of this gate and the input parity bit are compared by a single exclusive-NOR gate. The output of this final gate must be a logical one or a parity error exists in the input byte and its associated parity bit. If a parity error occurs, the parity checking logic generates a parity error signal. The designer may use the undedicated logic to perform whatever function is necessary in response to the error signal.

The two write enable registers 26 and 28 each hold four bits which are used to determine which of the four bytes of a write register 22 or 24, including the associated parity bit, will be written into the selected internal register associated with that write register. All, any, or none, of the bytes of each input port may be enabled for each write operation by loading the appropriate bit pattern into the write enable registers 26 and 28. The enable bits are used directly without any decoding. That is, for each port, the first enable bit is used to enable or disable the first byte, the second enable bit is used to enable or disable the second byte, and so on.

The write address registers 30 and 32 each hold four-bits which are used to specify the addresses of the internal registers 18 or the GPR 14 for the write operation. Each write address register 30 and 32 has its own address decoder 34 or 36. Each decoder 34 and 36 has the four address bits as the input and has sixteen outputs which are used to enable one of the sixteen internal registers 18 of the GPR 14. Only one of the sixteen outputs of each decoder 34 and 36 can be true at any time.

The six input control registers 22 through 32 insure that spurious write operations do not occur while the input signals are being changed. All six registers are loaded with the data on their inputs by the clock signal C. In addition, two clock enable signals, CA on the A write register 22, and CB on the B write register 24, are used to control the loading of data into the write registers. If the clock enable signal is false on a write register, the clock signal C does not load the input data into that write register. Since the write enable registers 26 and 28 and the write address registers 30 and 32 are always loaded by the clock signal C, the clock enable signals CA and CB allow data in the write register 22 or 24 to be held for more than one cycle while all or part of it is written into more than one internal register 18 of the GPR 14.

Figure 3:
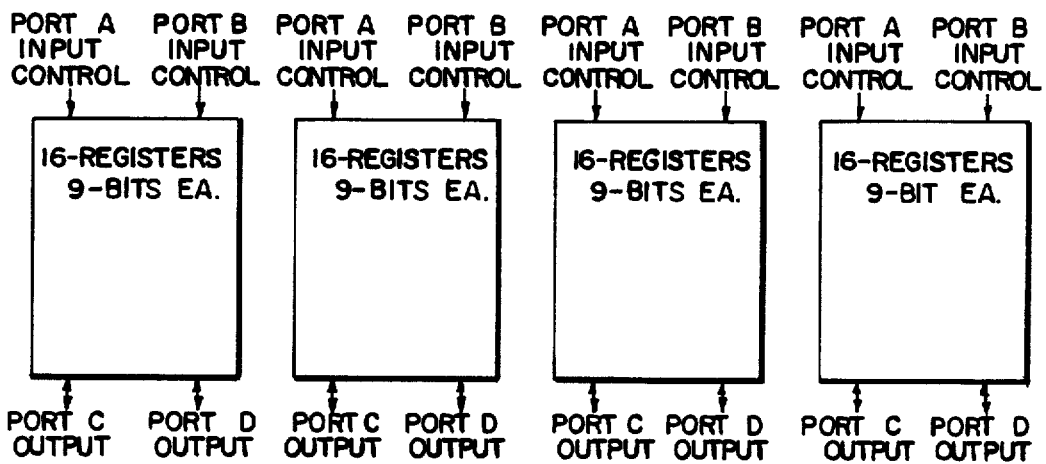
FIG. 3 is a block diagram showing the organization of the internal registers of the GPR.

Referring to FIG. 3, the internal registers 18 of the GPR 14 are organized as four independent sets of registers 38 through 44. Each set of registers consists of sixteen nine bit storage locations. Each set of registers has two sets of input port control signals, one from port A and one from port B. The input port control signals consist of the byte that is to be written, the write enable signal that determines whether the byte will be written, and the address of the byte. The address for a given input port is the same for all four bytes contained in each of the write registers 22 and 24. Each set of registers 38 through 44 also has two sets of output port signals, one for a C port and one for a D port. The output port signals consist of the address to be read, the byte read, and the byte bypassed from the write register 22 or 24. The address for a given output port is the same for all four bytes.

Figure 4:
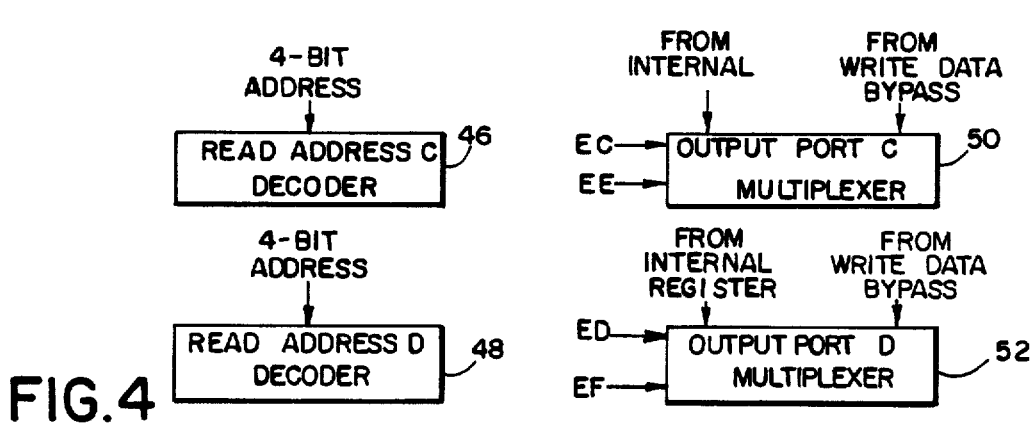
FIG. 4 is a block diagram showing the output control elements of the GPR.

The elements that make up the output control portion of the GPR are shown in FIG. 4. As can be seen in the Figure, there are two separate sets of output control elements, one for the C port and one for the D port. Each set consists of a read address decoder 46 or 48 and an output port multiplexer 50 or 52.

The read address decoders 46 and 48 are similar to the write address decoders 34 and 36 shown in FIG. 2. The output port multiplexers 50 and 52 select bytes from either the addressed internal register of the GPR 14 or from the write data bypass and put them on the output of the port. Four sets of read enable signals, EC, ED, EE and EF, are used to control the two output port multiplexers 50 and 52. Each set of read enable signals is four bits and they are used without any decoding; the first enable bit enables or disables the first byte, the second enable bit enables or disables the second byte, and so on. The read enable signals EC and ED enable or disable bytes from the addressed internal registers for ports C and D, respectively, while the bypass enable signals EE and EF enable signals from the write data bypass, from input ports A and B, to output ports C and D, respectively.

Figure 5:
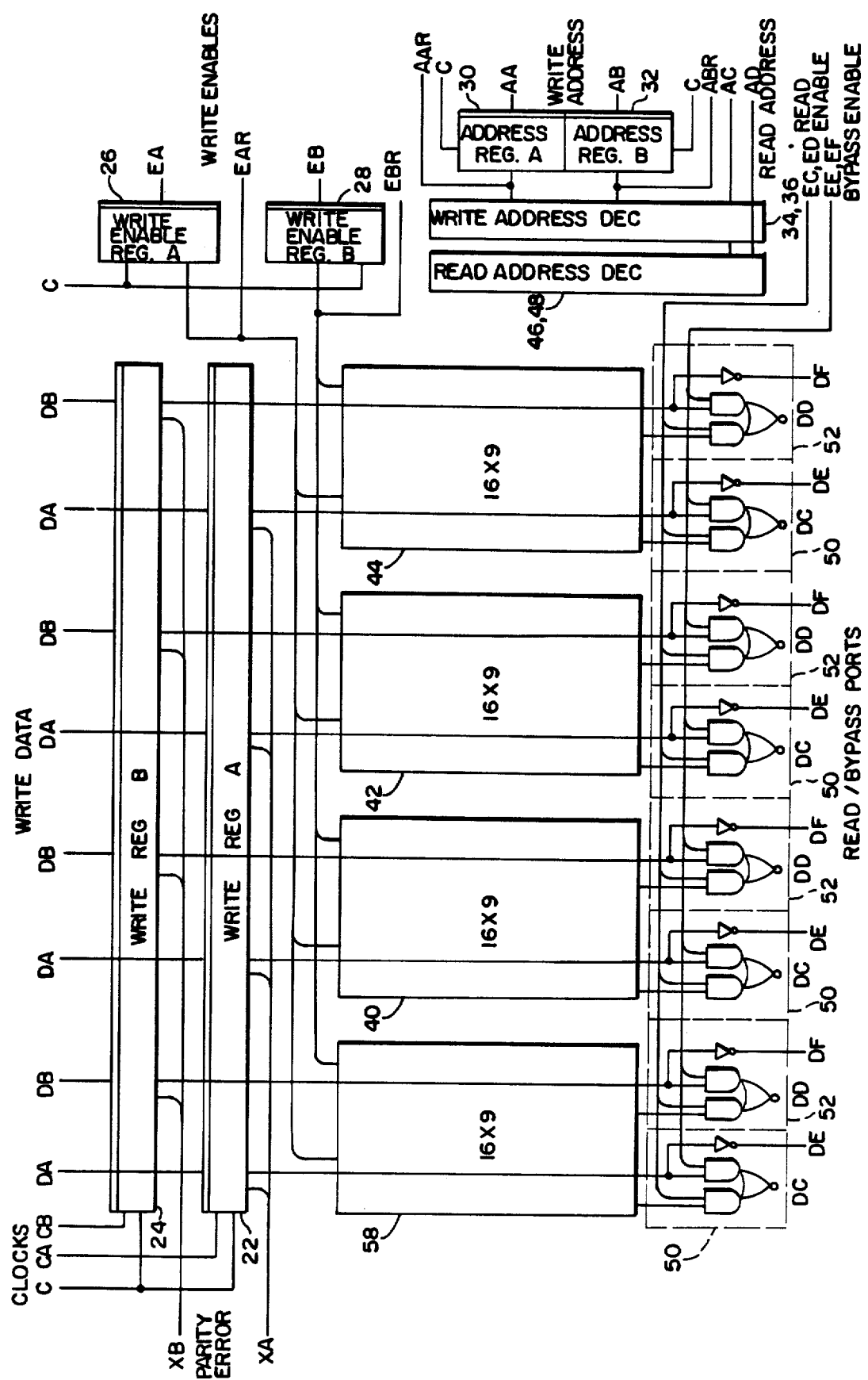
FIG. 5 combines the elements of FIGS. 3, 4, and 5 to show an overall block diagram of the GPR.

Referring to FIG. 5, the input port control elements, the internal register elements and the output port control elements are combined to give an overall block diagram of the GPR 14. The two thirty-six bit words, DA and DB, that are to be written into the selected internal registers are loaded by the clock signal C into the two write registers A22 and B24, respectively, dependent upon the state of the clock enable signals, CA and CB, respectively. At the same time, the two write enable registers A26 and B28 are loaded with the enable signals EA and EB, respectively, and the two write address registers A30 and B32 are loaded with the address signals AA and AB, respectively. The outputs of the two address registers are decoded by the write address decoders 34 and 36.

The outputs of the two write enable registers A and B are made available as the signals EAR and EBR, respectively, while the outputs of the two address registers A and B are made available as the signals AAR and ABR, rspectively. This is a unique feature of the invention which allows the designer to use the register outputs, along with the undedicated logic, to customize the design of the GPR chip, e.g., to multiplex the outputs back into the inputs to form a recirculating type register, incrementing the outputs before feeding them back to input to form a self-incrementing counter, etc.

At this time, the write operation takes place. The latches used in the internal registers are RS (reset-set) type latches which do not require a clock pulse. Those addressed bytes of the registers 38 through 44 that are enabled by the outputs of the two write enable registers 26 and 28 will have the corresponding byte of the appropriate write register 22 or 24 written into them. A write operation can be disabled by loading four false bits into the appropriate write enable register with the clock signal C. No write operation will occur on the selected register (the outputs of the two write address decoders are always selecting an internal register) since all four bytes will be disabled. The enable bits allow all, any, or none of four bytes in the write register to be loaded into the selected internal register for either port.

Another unique feature of the invention is the capability of selecting some number of bytes from one write register and some number of bytes from the other write register to be written into a single internal register. When using this feature, the same address must be loaded in both write address registers 30 and 32. This feature also allows bytes to be interchanged between the two words in the write register. As an example, suppose it is necessary to interchange the odd numbered bytes. On the first write cycle, the two write enable registers 26 and 28 would be loaded with bits that would enable the even numbered bytes from write register A 22 and the odd numbered bytes from write register B 24 to be written into the addressed internal register. During the next clock signal C, the two write enable registers 26 and 28 would be loaded with a new set of bits and the two address registers 30 and 32 would be loaded with an identical address (but different from the one used during the first operation). However, the two clock enable signals are held false, and the contents of the two write registers 22 and 24 are not changed. The second set of write enable signals would enable the even numbered bytes from write register B 24 and the odd numbered bytes from write register A 22 to be written into the currently addressed internal register. At the end of the second write cycle, two internal registers contain the original two words from the write registers with their odd numbered bytes interchanged.

The read address signals AC and AD for the two output ports C and D, respectively, are applied to the read address decoder 46, 48 respectively. The enable signals EC, ED, EE and EF are applied to the output port multiplexers 50 and 52. A read operation is always taking place on the addressed internal registers. However, the read enable signals and/or external circuitry and timing determine if the internal register outputs will be used. The read enable signals EC and EE control the operation of the output port C multiplexer 50 while read enable signals ED and EF control output port D multiplexer 52. The contents of the two write registers 22 and 24 are connected to both the internal registers and to the output port multiplexers 50 and 52. This is a unique feature of the invention, called write data bypass, which allows the data in the write register to be written into an addressed internal register and also be multiplexed onto an output port. There are many operations in a computer where the data being stored in the GPR is needed for the next operation. Because of the inherent timing of a GPR, data cannot be written into an internal register and read from the internal register during the same cycle. The provision of the write data bypass enables data entered into the GPR 14 to be read out for use in the next cycle.

Figure 6:
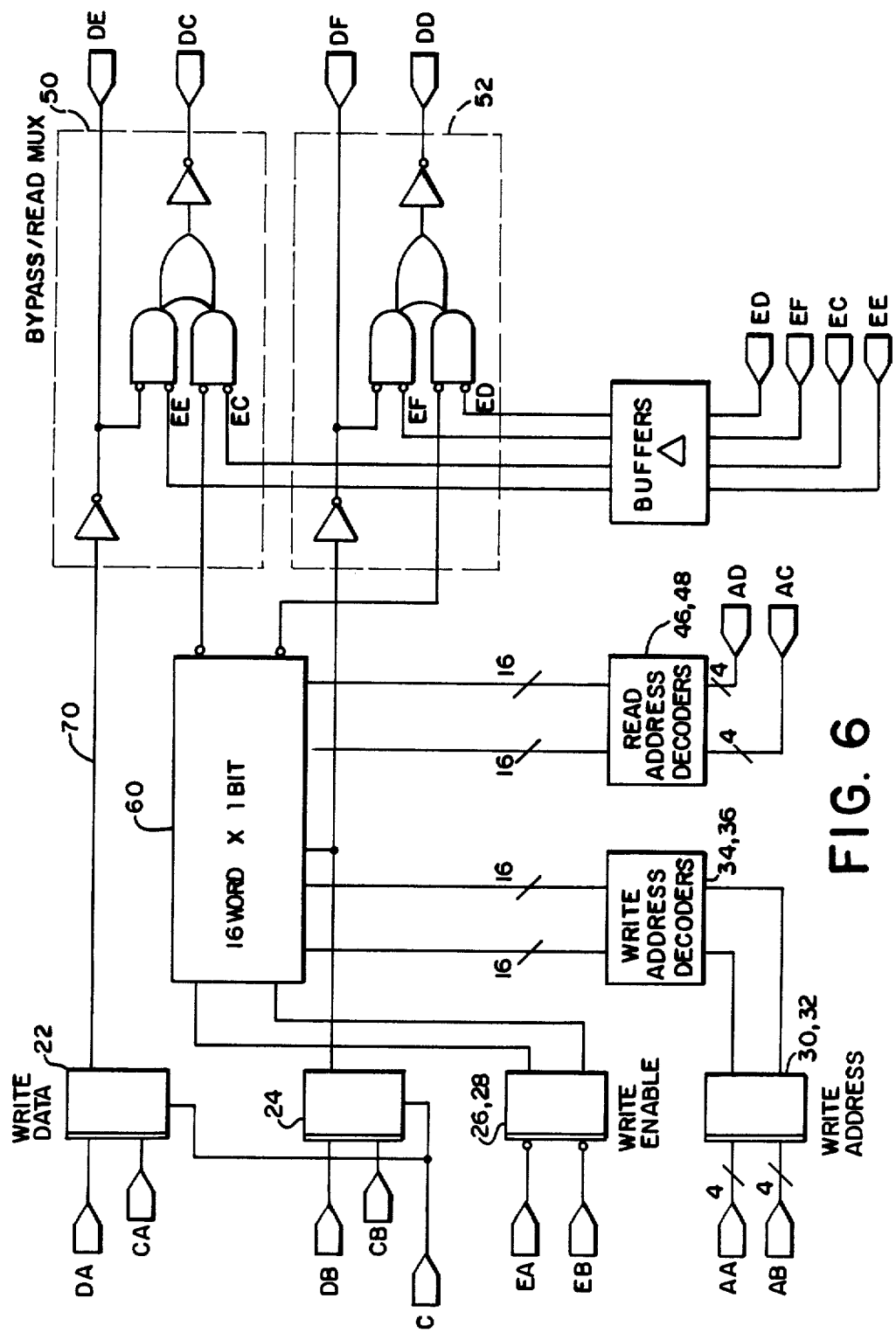
FIG. 6 is a block diagram of the GPR showing the details of the output port multiplexers.

Referring to FIG. 6, the details of the output port multiplexers are shown. FIG. 6 is similar to FIG. 5 except only one bit is illustrated. To truly represent the entire GPR 14, the sixteen word by one bit box 60 and the two output port multiplexers 50 and 52 would have to be shown thirty-six times. The remaining elements of FIG. 6 would be common to all thirty-six bits, with the exception of the read enable signals EC, ED, EE and EF. These signals are four bits each with each bit controlling a byte on the output ports. The output port C multiplexer 50 is controlled by the read enable signals EC and EE. If the read enable signal EC is true, the appropriate byte from the internal register addressed by address signals AC will be gated onto the output of port C. If the read enable signal EE is true, the appropriate byte from write register A 22 will be gated, by means of the write data bypass line 70, onto the output of port C.

A unique feature of the invention is that some number of bytes from the addressed internal register and some number of bytes from the write register can be used, by the proper selection of EC and EE, to form the port C output. The read enable signals ED and EF control the output of port D in a manner similar to the manner in which EC and EE control port C. However, the output of port D will be either from the internal register addressed by address AD or from write register B.

The write data bypass lines 70 and 72 from the two write registers A 22 and B 24 are made available as the signals DE and DF, respectively. The designer can use these signals, along with the undedicated logic, to customize the GPR 14 for those applications where both the data from the internal register and the data in the write register are required for the next cycle.

Figure 7:
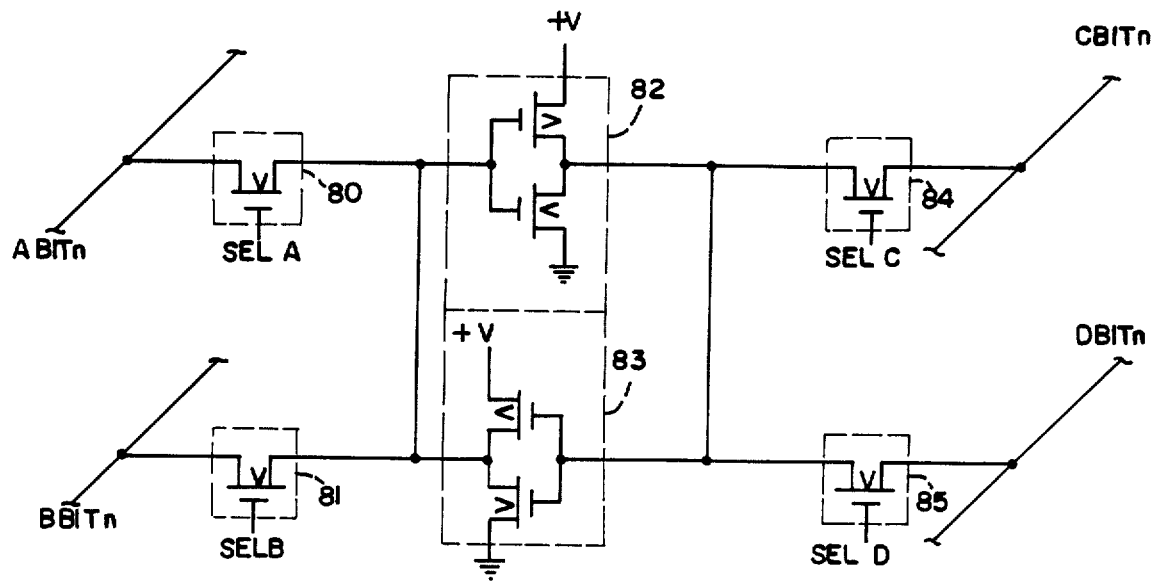
FIG. 7 is a circuit diagram of an internal cell of the GPR.

FIG. 7 is a circuit diagram of an internal cell of the GPR 14. The basic storage element of the cell is the pair of inverters 82-83. The two inverters 82-83 are connected in a loop; the output of inverter 82 is connected to the input of inverter 83, and the output of inverter 83 is connected to the input of inverter 82. Hence, the signal applied to the input of inverter 82 is inverted and applied to the input of inverter 83, which inverter 83 inverts it again and applies it back to the input of inverter 82. Thus, when the input signal is changed, it is latched by these two inverters.

The input to the cell comes from two sources, shown as ABITn and BBITn, where n represents one of the thirty six bits from the A and B write registers 22-24 (see FIG. 6), respectively. Each nth-bit from each input port, A and B, is applied to all sixteen nth-cells via the busses represented by ABITn and BBITn, respectively.

The two transistors 80-81 determine which of the two input bits will be written into the cell. The transistors 80-81 are controlled by the select signals, SELA and SELB. The signal SELA is the logical AND of the decoded address for this cell, as decoded by the write address A decoder 34 (see FIG. 6), and the write enable signal EA. This SELA signal is applied to each of the thirty six cells that make up the register with this address. Each of the sixteen registers have their own unique SELA, as determined by the write address A decoder. The signal SELB is similar except the output of the write address B decoder 36 and the write enable signal EB are used to generate the signal.

During the write portion of the cycle, either or none of the two transistors 80-81 will be turned on, depending upon the signals SELA and SELB, respectively. If one of them is turned on, the appropriate input signal, ABITn or BBITn, will be applied to the input of the inverter 82.

The inverter 83 is required because of the leakage current from the gates of the transistors of the inverter 82. If there were no leakage current, the input signal could charge or discharge the gates of inverter 82 and its output would remain unchanged until the input was changed. Because of the leakage, inverter 83 is required to hold the input of inverter 82 to the desired level.

The transistors of the inverter 83 are physically relatively small. They have sufficient drive capability to replenish the leakage current of the input of inverter 82 but not enough drive capability to overcome the input signal from the select transistors 80 or 81. Thus, if the output of the inverter 83 is low, the input signal from the select transistor 80 or 81 can pull it to a high level.

The transistors of the inverter 82 are physically relatively large. They have sufficient drive capability to give a fast rise to the output signal during the read cycle. Thus, the invention conserves area on the chip by making the transistors of the cell of unequal physical sizes, but of the appropriate size to perform their desired function.

The output of the cell goes to two destinations, CBITn and DBITn, as shown in the FIG. 7. These two lines are similar to the two input lines, where n represents one of the thirty six bits on the output of the register 60 (see FIG. 6) that are the input to the bypass/read multiplexers 50 and 52.

The output of the cell is directed to either the C port or the D port by the transistors 84 and 85 which are controlled by the select signals SELC and SELD, respectively. These two signals are generated by the read address decoders 46-48 (see FIG. 6).

As in the case of the input, a unique SELC and a unique SELD are applied to all thirty six bits of each of the sixteen registers of the GPR 14. Thus, any of the sixteen registers can be selected by SELC and any of the remaining fifteen registers can be selected by SELD.

In summary, the present invention provides a GPR having two input ports and two output ports and four independent addresses. This arrangement provides a substantial improvement in the operating speed of a computer which utilizes the GPR. Although the invention has been described in terms of a particular embodiment, modification within the scope of the invention will be apparent to those skilled in the art. Therefore, the scope of the invention should be determined with reference to the appended claims rather than the foregoing description.

We claim:

1. A general purpose register having two sets of address lines for temporary storage of data in a computer system, comprising:

a plurality of internal storage registers residing within a single integrated circuit package;

first input control means connected to said internal storage registers for writing data into a selected internal storage register;

second input control means connected to said internal storage registers for writing data into another selected internal storage register;

said first and second input control means each including addressing means for selecting an internal storage register to which data is to be transferred and a write register for receiving an input data word, the data in said write register being subsequently transferred to said selected internal storage register in response to a first control signal;

first output control means connected to said internal storage registers for reading data from a selected internal storage register to a first output terminal; and second output control means connected to said internal storage registers for reading data from a selected internal storage register to a second output terminal;

bypass means for selectively transferring data from the first and second input control means write registers directly to the first and second output terminals, respectively, without being stored in said internal storage registers;

said input and output control means independently and simultaneously accessing four internal storage registers, thereby writing into two internal storage registers and reading from another two internal storage registers; and said input and output control means residing within the same integrated circuit package as said internal storage registers.

2. A general purpose register according to claim 1 wherein each input data word is comprised of a plurality of bytes, wherein each input control means further includes write enable means for selecting which one or ones of the bytes of the input data word will be written into the selected internal storage register, wherein the operation of the write enable means is controlled by the first control signal.

3. A general purpose register according to claim 2 wherein each write enable means comprises a write enable register.

4. A general purpose register according to claim 1 wherein the bypass means comprises first and second multiplexers, each coupled to a corresponding write register and the internal storage registers, wherein the output lines of the first and second multiplexers are coupled to the first and second output terminals respectively.

5. A general purpose register for storage of data in a computer system, comprising:

a plurality of internal storage registers residing within a single integrated circuit package;

first input control means for writing input data words into said internal storage registers;

second input control means for writing input data words into said internal storage registers, each data word being comprised of a plurality of data sections, each input control means including addressing means for selecting an internal storage register to which an input data word is to be transferred and enable means for determining which data sections of said input data word are to be written into the selected internal storage register;

first output control means for reading data from a selected one of said internal storage registers to a first output terminals;

second output control means for reading data from another selected one of said internal storage registers to a second output terminal;

said input and output control means independently and simultaneously accessing four internal storage registers, thereby writing into two internal storage registers and reading from another two internal storage registers, and said input and output control means residing within the same integrated circuit package as said internal storage registers.

6. A general purpose register according to claim 5 wherein each input control means includes a write register for receiving the input data word, said enable means determining which data sections of the input data word in said write register is to be written into the selected internal storage register, and each output control means including output enabling means for determining which data sections of a selected data word in an internal storage register are to be read to the associated output terminal.

7. A general purpose register according to claim 5 wherein the addressing means of each input control means can simultaneously address the same internal storage register, whereby predetermined data sections from each of the write registers can be written into a single internal storage register.

8. A general purpose register according to claim 6 further including bypass means connected to each write register for bypassing the internal storage registers and transferring predetermined data sections of the input data word in the write register directly to a corresponding output terminal, whereby data sections from the internal storage registers and write registers can be combined to form desired output data words which are read to the corresponding output terminal.

9. An integrated circuit chip having an undedicated area and an area dedicated for implementing a general purpose register and its associated addressing circuitry, comprising:

undedicated circuitry comprising a first array of complementary MOS transistor pairs, wherein the transistors are selectively interconnected to perform a particular defined function; and general purpose register circuitry comprising a second array of complementary MOS transistor pairs, said general purpose register circuitry comprising a plurality of internal storage registers, first input control means for addressing the internal storage registers to provide an input data word thereto said input data word being comprised of a plurality of data sections, second input control means for addressing the internal storage registers to provide another input data word thereto, first output control means for addressing the internal storage registers to obtain a data word therefrom, and second output control means for addressing the internal storage registers to obtain a data word therefrom, each of said control means being connected to said internal storage registers, said input and output control means independently and simultaneously accessing four internal storage registers, thereby writing into two internal storage registers and reading from another two internal storage registers each input control means including enable means for determining which data sections of the input data word are to be provided to the addressed internal storage register, each output control means including enable means for determining which data sections of the data word are to be read from the addressed internal storage register.

10. An integrated circuit chip as defined in claim 9 wherein said internal storage registers comprise a pair of inverter circuits connected in a loop such that the output of one is connected to the input of the other, and further including means for selectively connecting either input of said pair of inverter circuits to one of two input signal lines, and means for selectively connecting either output of said pair of inverter circuits to one of two output signal lines.

11. In a computer system, a general purpose register having two or more input ports for the temporary storage of data words applied to said input ports, each data word including two or more data sections, comprising:

a plurality of internal storage registers for storing data words;

two or more input control means, associated on a one-to-one basis with said input ports, for storing input data words in said internal storage registers, each input control means including:

write address register means for selecting an internal storage register to store an input data word, write register means connected to the associated input port and said internal storage registers for writing an input data word from said input port to said selected one of said internal storage registers, and write enable register means connected to said write register means for selecting the ones of the data segments in said input data word that are written into said selected internal storage register.

12. The general purpose register of claim 11 further comprising:

two or more output ports;

two or more multiplexer means, associated on a one-to-one basis with said output ports, each of said multiplexer means having a first input connected to said internal storage registers, an output connected to said associated output port, and a second input;

interconnection means connected to both said write register means and said second input of said multiplexer means for directly coupling said data word from said write register means to said multiplexer means;

two or more output control means, associated on a one-to-one basis with said output ports, each comprising:

read address register means for selecting one of said internal storage register means to output a data word to the corresponding multiplexer means; and read enable register means for selecting the ones of said data sections read from said selected internal storage register to said multiplexer means.

13. The general purpose register of claim 12 further comprising:

bypass enable signal means for activating said multiplexer means to couple said data word from said interconnection means to said associated output port.

14. In a computer system, a general purpose register having two or more input ports and two or more output ports for the temporary storage of data words applied to said input ports, each data word including a plurality of data sections, comprising:

a plurality of internal storage registers for storing data words;

two or more write register means, associated on a one-to-one basis with said input ports, and connected to said internal storage registers for storing an input data word, applied to the associated input port, in an internal storage register;

two or more multiplexer means associated on a one-to-one basis with said output ports, having a first input connected to said internal storage registers, an output connected to said associated output port, a second input connected to a corresponding one of said write register means; and control means for controlling the concurrent coupling to a selected multiplexer, data segments from a data word in said corresponding write register means and selected data segments from a data word stored in a selected one of said internal storage registers, said concurrently coupled data segments being output by said selected multiplexer to said associated output port.

15. The general purpose register of claim 14 further comprising:

bypass enable signal means for activating said multiplexer means to couple a data word from said corresponding write register means to said associated output port.

16. The general purpose register of claim 14 wherein said control means comprises:

read address register means for selecting one of said internal storage registers to output a data word to said multiplexer means;

read enable register means for selecting the ones of said data sections read from said selected internal storage register to said multiplexer means; and write enable register means for selecting the ones of said data segments read from said write register means to said multiplexer means.

* * * * *

UNITED STATES PATENT AND TRADEMARK OFFICE
CERTIFICATE OF CORRECTION

PATENT NO. : 4,737,933

DATED : April 12, 1988

INVENTOR(S) : Michael Chiang et al

It is certified that error appears in the above-identified patent and that said Letters Patent is hereby corrected as shown below:

Col. 1, line 46, "Alterntively" should be --Alternatively--.

Col. 9, line 5, "terminals" should be --terminal--.

Col. 11, line 17, "of" is omitted before data.

Signed and Sealed this

Fifteenth Day of November, 1988

Attest:

DONALD J. QUIGG

*Attesting Officer*  *Commissioner of Patents and Trademarks*